United States Patent [19]

Sakai

[11] Patent Number: 5,321,280
[45] Date of Patent: Jun. 14, 1994

[54] COMPOSITE SEMICONDUCTOR INTEGRATED CIRCUIT DEVICE

[75] Inventor: Isami Sakai, Tokyo, Japan

[73] Assignee: NEC Corporation, Tokyo, Japan

[21] Appl. No.: 760,068

[22] Filed: Sep. 13, 1991

[30] Foreign Application Priority Data

Sep. 13, 1990 [JP] Japan .................................. 2-243083

[51] Int. Cl.$^5$ .................... H01L 27/10; H01L 27/118
[52] U.S. Cl. ..................................... 257/211; 257/208; 257/758
[58] Field of Search ............... 257/211, 207, 203, 208, 257/202, 758

[56] References Cited

U.S. PATENT DOCUMENTS

| | | | |
|---|---|---|---|
| 4,780,846 | 10/1985 | Tanabe et al. | 257/207 |
| 5,008,728 | 4/1991 | Yamamura et al. | 257/211 |
| 5,060,045 | 10/1991 | Owada et al. | 257/211 |
| 5,119,158 | 6/1992 | Hatano | 257/203 |

OTHER PUBLICATIONS

T. Takahashi et al. "A 1.4 M-Transistor CMOS Gate Array with 4 ns RAM", ISSCC Digest of Tech. Papers, pp. 178–179 and 332 (1989).
Nikkei Microdevices, Jun. 1989, pp. 86–101.

Primary Examiner—William Mintel
Assistant Examiner—Alexander Oscar Williams
Attorney, Agent, or Firm—Burns, Doane, Swecker & Mathis

[57] ABSTRACT

A composite semiconductor integrated circuit device includes logic circuit blocks of a master slice system and function blocks such as memories all of which are integrated on a single semiconductor chip. The function blocks are constituted with n lower metal wiring layers. On a portion of a surface of the chip which overlaps with the function block, a (n+1)th metal layer is not provided as signal wiring, but a (n+2)th metal wiring layer or higher layers are provided. The step coverage of the metal wiring layers provided on the chip surface portion overlapping with the function block is improved and cross-talk between signal lines can be reduced.

10 Claims, 8 Drawing Sheets

COMPOSITE SEMICONDUCTOR INTEGRATED CIRCUIT DEVICE

BACKGROUND OF THE INVENTION

The present invention relates to a semiconductor integrated circuit device (IC) and, particularly, to a semiconductor IC capable of realizing desired functions by using a CAD automatic wiring technique.

Such a semiconductor IC includes a master slice type semiconductor IC which includes, for example, a memory such as ROM or RAM and functional blocks such as ALU, PLA and/or CPU. The semiconductor IC of this type will be referred to simply as a "composite semiconductor IC" hereinafter.

In the composite semiconductor IC, a multilevel wiring technique of a three-level metal wiring structure or more is employed with an increase in number of gates to be integrated on a single semiconductor chip. For example, T. Takahashi et al., "A 1.4M-Transistor CMOS Gate Array with 4 ns RAM", ISCC DIGEST OF TECHNICAL PAPER, p. 178-179, February 1989 discloses a gate array including 130K logic gates and eight 128 word×36 bit RAMs integrated on a 14.5×14.5 mm² chip by use of a three-level metal wiring structure. Further, a gate array using a four-level metal wiring structure is disclosed in NIKKEI MICRODEVICES, p. 86 to 101, June 1989.

Function blocks included in a composite semiconductor IC are manually designed on the basis of a standard IC and arranged in a particular area of the chip of the composite semiconductor IC. Therefore, the integration density of an element of the function block is higher and the block can be realized with a smaller number of wiring layers compared with the master slice portion thereof. However, higher integration density of a function block means that the surface of the function block area of the semiconductor chip becomes uneven after an uppermost metal wiring is provided.

In order to improve the integration density of the composite semiconductor IC, it is preferable to provide a metal wiring used for the master slice portion further on the area of the function blocks of the semiconductor chip surface. In such a case, an inter-layer insulating film covering the function blocks is formed and the metal wiring is provided thereon. Since, however, the unevenness of the chip surface of the function block area is large, the step coverage, which is a ratio of minimum thickness of the metal wiring in a stepped portion to thickness of the wiring on the flat portion, is low and may deteriorate reliability. Further, the metal wiring formed on the function blocks through the inter-layer insulating film necessarily includes signal lines connected to circuits in the master slice portion, resulting in a cross-talk between the signal lines and signal lines of the function blocks which may cause a malfunction of the function blocks.

BRIEF SUMMARY OF THE INVENTION

An object of the present invention is to provide a composite semiconductor IC capable of increasing integration density without degrading reliability of the metal wiring.

The composite semiconductor IC according to the present invention includes function blocks and master slice logic circuit blocks, all being integrated on a single semiconductor chip. Metal wiring layers of the function blocks include a first level wiring layer to a n-th level wiring layer, where n is an integer, and wiring layers of the logic circuit blocks include first to (n+2)th level wiring layers. On the chip surface of the function blocks, at least the (n+2)th level wiring layer is provided through two inter-layer insulating films. The (n+2)th level wiring layer is connected to circuits of the logic circuit blocks.

Two inter-layer insulating films are provided between the function blocks and the wiring layer overlapping thereon. Since the surface of these two inter-layer insulating films is relatively flat, the step-coverage of the metal wiring layer is improved. Further, parasitic capacitance between the circuits of the function blocks and the signal lines overlapped thereon becomes smaller, promoting prevention of the aforementioned cross-talk. Further, since the metal wiring is also formed on portions overlapping with the function blocks, the integration density is improved accordingly.

Further, the conductive film formed on the interlayer insulating film covers the surfaces of the function blocks, that is, the (n+1)th level conductive layer, can be provided as a shield electrode film. The shield electrode film contributes to further prevent the cross-talk.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein.

DETAILED DESCRIPTION OF THE PREFERRED EMBODIMENTS

Figure 1:
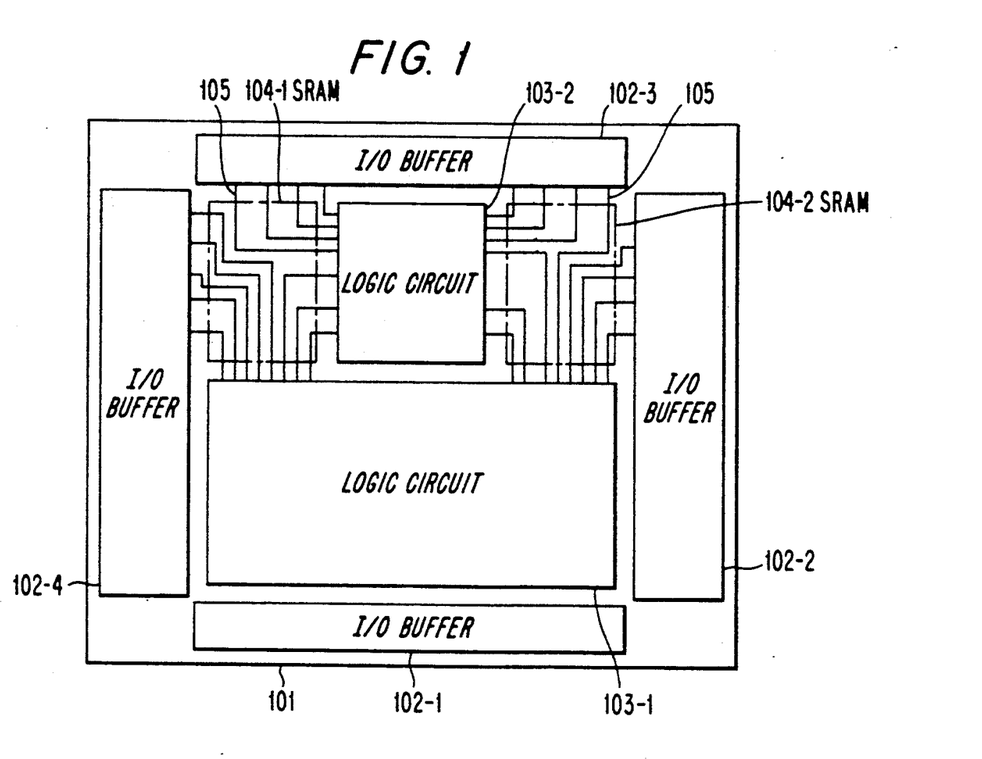
FIG. 1 is a schematic plan view of a semiconductor chip according to a first embodiment of the present invention.

Referring to FIG. 1, a composite semiconductor IC according to a first embodiment of the present invention comprises logic circuit blocks 103-1 and 103-2 each in the form of gate array and, as function blocks, SRAMs 104-1 and 104-2, all being integrated on a substantially square semiconductor chip 101 having each side of 15 mm. Input/output buffers 102-1, 102-2, 102-3 and 102-4 are arranged in a peripheral area of the semiconductor chip 101.

The SRAMs 104-1 and 104-2 are arranged adjacent to the input/output buffers 102-2, 102-3 and 102-4. The input/output buffers 102-1 to 102-4, the SRAMs 104-1 and 104-2 and the logic circuit blocks 103-1 and 103-2 are connected mutually by metal wiring layers (not shown).

A gate array type composite semiconductor IC is realized by preparing a master wafer having desired impurity diffusion regions formed through predetermined diffusion processes and suitably connecting the impurity diffusion regions mutually according to desired functions, that is, customizing the IC chip in wiring steps. Wiring patterns in the wiring steps are designed by using a CAD technique.

As to be described later, the logic circuit blocks 103-1 and 103-2 are constituted with function cells each of which is a basic logical function unit having input terminals and output terminals. A desired circuit function is described by connection information indicative of whether or not these function cells are to be mutually connected. These function cells are automatically arranged by CAD on the basis of the connecting information and the input terminals and the output terminals of the respective function cells are automatically wired. Since the input/output buffers 102-1 to 102-4 include circuit portions such as protecting circuits against a surge current, which is not suitable for automatic wiring by CAD, CAD is not applied to these portions. However, in order to clearly define the range to which the CAD automatic wiring is applicable, imaginary external terminals are set in a border between the logic circuit blocks 103-1 and 103-2 and the input/output buffers 102-1 to 102-4, through which they are connected.

Each of the SRAMs 104-1 and 104-2 is a 1024 word×8 bit MOS SRAM which is manually designed.

The input and output terminals of the SRAMs 104-1 and 104-2 are arranged in their peripheries and automatically wired by a CAD technique.

The logic circuit blocks 103-1 and 103-2 in this embodiment include first level to fourth level aluminum wiring layers. The input and output terminals of the SRAMs 104-1 and 104-2 are formed by using the first and second level aluminum wiring layers.

Two inter-layer insulating films to be described later are formed on the SRAMs 104-1 and 104-2 and metal wiring layers 105 made of the fourth level aluminum film are arranged on these insulating films. The wiring layers 105 connect the logic circuit block 103-1 to the logic circuit block 103-2, the logic circuit block 103-1 to the input/output buffers 102-2, 102-3 and 102-4 and the logic circuit block 103-2 to the input/output buffer 102-3.

Although only the wiring layer covering the SRAMs 104-1 and 104-2 is shown in FIG. 1, it is possible to form the connections of these constructive elements by means of the third and fourth level aluminum wiring layers by by-passing the chip surface portions on these SRAMs. That is, when the automatic wiring is performed using a CAD technique, it is enough to make the region in which the SRAMs are to be arranged as an inhibiting region for the first to the third level aluminum wiring layers and to perform a main axis wiring and a sub-axis wiring by means of the fourth level aluminum wiring layer. The term "main axis wiring" means a wiring in a direction set temporarily by a CAD technique and "sub-axis wiring" means a wiring in a direction perpendicular to the main axis direction. Although the main axis wiring of a certain wiring layer on a complete semiconductor chip is usually longer than the sub-axis wiring, a limitation in the sense of length is not always necessary.

Figure 2:
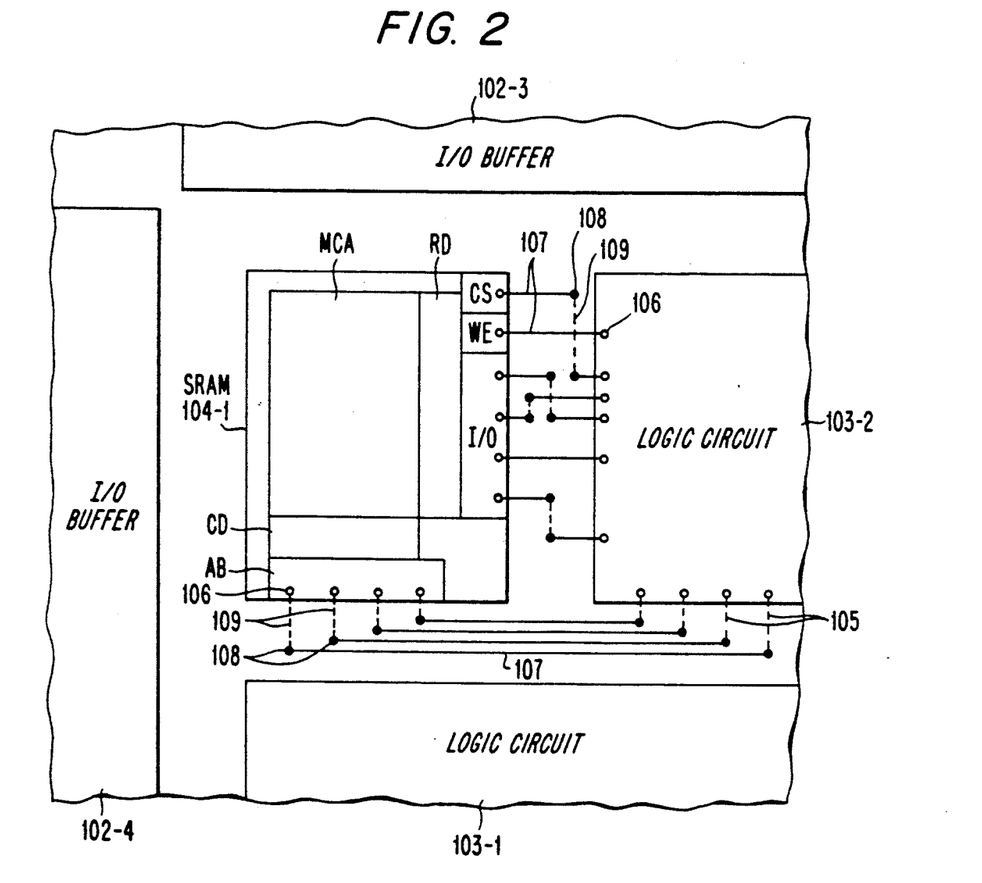
FIG. 2 is a plan view schematically showing connections between SRAMs and logic circuit blocks in the first embodiment.

Now, the connection between the SRAMs 104-1 and 104-2 and the logic circuit blocks 103-1 and 103-2 will be described. Referring to FIG. 2 showing the connecting relation between the SRAM 104-1 and the logic circuit block 103-2, these elements are connected by a first level aluminum wiring layer 107 shown by a solid line extending in an x direction and a second level aluminum wiring 109 shown by a dotted line extending in a Y direction. Open circles indicate terminals of the SRAM 104-1 and the logic circuit block 103-2 and solid circles indicate through-holes for connecting the first level aluminum wiring layer 107 and the second level aluminum wiring layer 109. A chip select terminal CS, a write enable terminal WE and a plurality of input/output terminals I/O of the SRAM 104-1 are connected through portions of the first level aluminum wiring layer 107 extending in the X direction to the terminals of the logic circuit block 103-2 directly or indirectly through other portions of the first level aluminum wiring layer 107 extending in the X direction, the through-holes 108 and portions of the second level aluminum wiring layer 109 extending in the Y direction. Terminals of an address buffer AB of the SRAM 104-1 are connected to address terminals of the logic circuit block 103-2 through portions of the second level aluminum wiring layer 109 extending in the Y direction, portions of the first level aluminum wiring layer 107 extending in the X direction, the through-holes 108 and portions of the second level aluminum wiring layer 109 extending in the Y direction. In brief, the SRAM 104-1 and the logic circuit block 103-2 are connected to each other by means of the first level aluminum wiring layer 107 and the second level aluminum wiring layer 109. Similarly, the SRAM 104-2 (FIG. 1) is connected to the logic circuit block 103-1 (FIG. 1) or 103-2.

Figure 3:
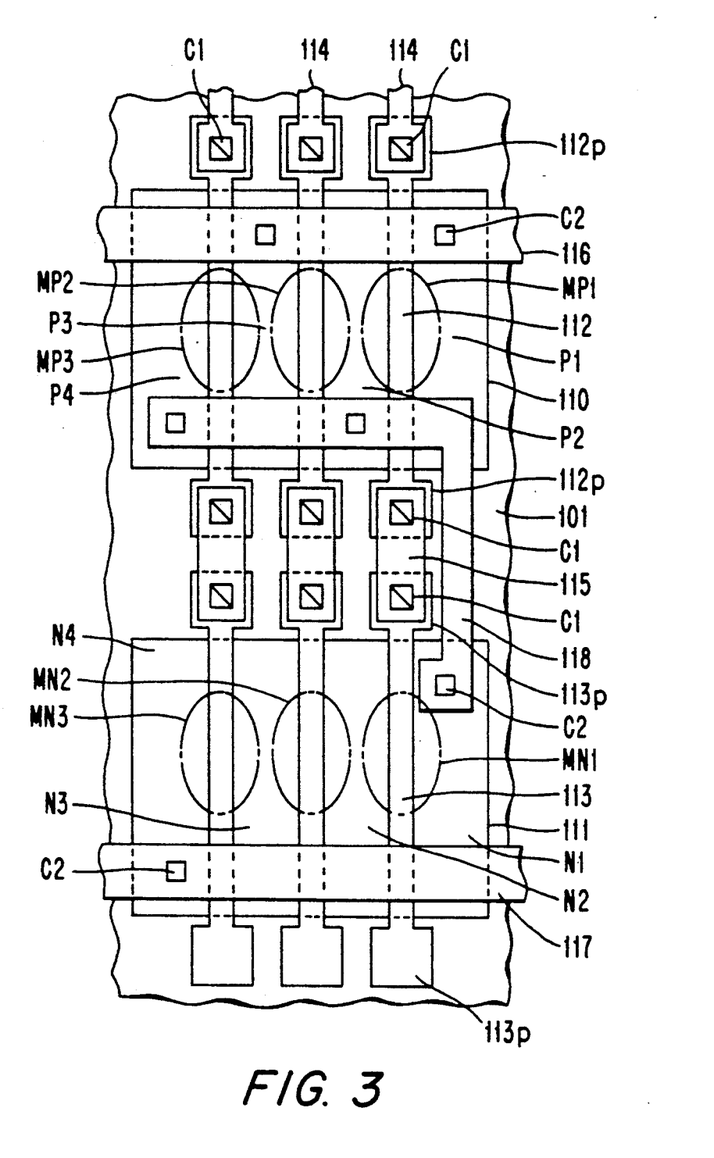
FIG. 3 is a plan view schematically showing an example of a function cell of a gate array constituting the logic circuit blocks in the first embodiment.

Referring to FIG. 3 showing a 3-input NAND gate which is a function cell of the logic circuit blocks 103-1 and 103-2, the 3-input NAND gate is realized by forming the first level aluminum wiring layer on a basic cell preliminarily prepared by diffusion of a predetermined impurity. The basic cell is a basic constitutional element of the gate array and constituted with three pairs of transistors.

Describing the basic cell in detail, an element forming region 110 surrounded by an element isolating region such as a field oxide film is formed in an N well formed in a surface portion of a P type silicon substrate, which is not shown. A gate oxide film 11 nm thick (numerical values in this specification are design values unless otherwise indicated) is provided on the N well of the element forming region 110 and three gate electrodes 112 of a first level polysilicon film are provided thereon. Contact pads 112p are provided at opposite ends of each gate electrode 112. A P type impurity such as boron is injected into a surface portion of the N well using the gate electrodes 112 and the field oxide film as masks, resulting in P+ type impurity diffusion layers P1 to P4. Similarly, a gate oxide film 11 nm thick is provided on the P type silicon substrate surface of an element forming region 111 and three gate electrodes 113 of the first level polysilicon film are provided thereon in a direction crossing the gate oxide film. An N type impurity such as phosphor is injected into a surface portion of the P type silicon substrate using the gate electrodes 113 and the field oxide film as masks, resulting in N+ type impurity diffusion layers N1 to N4. Thickness and width of each of the gate electrodes 112 and 113 are 0.4 μm and 0.6 μm, respectively, and these electrodes are doped with phosphor at a density of $1 \times 10^{21}/cm^3$.

A plurality of such basic cells are arrayed on a semiconductor chip and an inter-layer insulating film is formed thereon. A number of such cells constitute a master wafer. The 3-input NAND gate is formed by providing wirings on the master wafer.

Now, the 3-input NAND gate will be described with reference to FIG. 3.

In FIG. 3, source regions of three P-channel MOS transistors MP1, MP2 and MP3, that is, the rightmost P+ type impurity diffusion region P1 and the P+ type impurity diffusion region P3 which is the third one from the P1 region, are connected to a power source wiring 116 to a power source ($V_{DD}$). Drain regions, that is, the leftmost N type impurity diffusion layer N4 and the N+ type impurity diffusion layer N2 which is third one from the layer N4 are connected to an output line 118. The output line 118 is connected to the N+ type impurity diffusion layer N1 provided in a right end portion of the element forming region 111. The N+ type impurity diffusion layer N4 provided in a left end portion of the element forming region 111 is connected to a power source wiring 117 to a power source (Vss). The gate electrodes 112 of these three P-channel MOS transistors are connected to the input line 114 through the through-holes C1 and the contact pads 112p. The gate electrodes 112 of the P channel MOS transistors and the gate electrodes 113 of the N channel MOS transistors are connected to the wiring 115 through the through-holes, respectively. The wirings 114, 115, 116, 117 and 118 are of portions of the first level aluminum wiring layer 0.6 μm thick.

The logic circuit blocks 103-1 and 103-2 are realized by combining the basic cells and the function cells. Wiring for combining these cells is usually designed by a CAD system and composed of the first level aluminum wiring layer to the fourth level aluminum wiring layer. Thickness, width and pitch of the first, second, third and fourth level aluminum wirings are 0.6 μm, 1.0 μm, 2.0 μm; 0.8 μm, 1.2 μm, 2.4 μm; 0.8 μm, 1.6 μm, 3.0 μm; 1.1 μm, 2.0 μm, and 3.6 μm, respectively. The thickness of the inter-layer insulating films is commonly about 1.0 μm and is in the form of a three layer structure of SiO$_2$ film/SOG film/SiO$_2$ film, where the SOG (Spin-On-Glass) film is used mainly to fill recessed portions and therefore there is usually no SOG film on a flat portion. The thickness of each SiO$_2$ film is 0.5 μm and formed by CVD.

The SRAM 104-1 will be described next.

The memory cell array is constituted by using the first and second level aluminum wiring layers.

A peripheral portion of the chip other than the memory cell array, that is, a peripheral circuit portion in which element density is lower than that in the memory cell array, uses the first level aluminum wiring layer.

Figure 4:
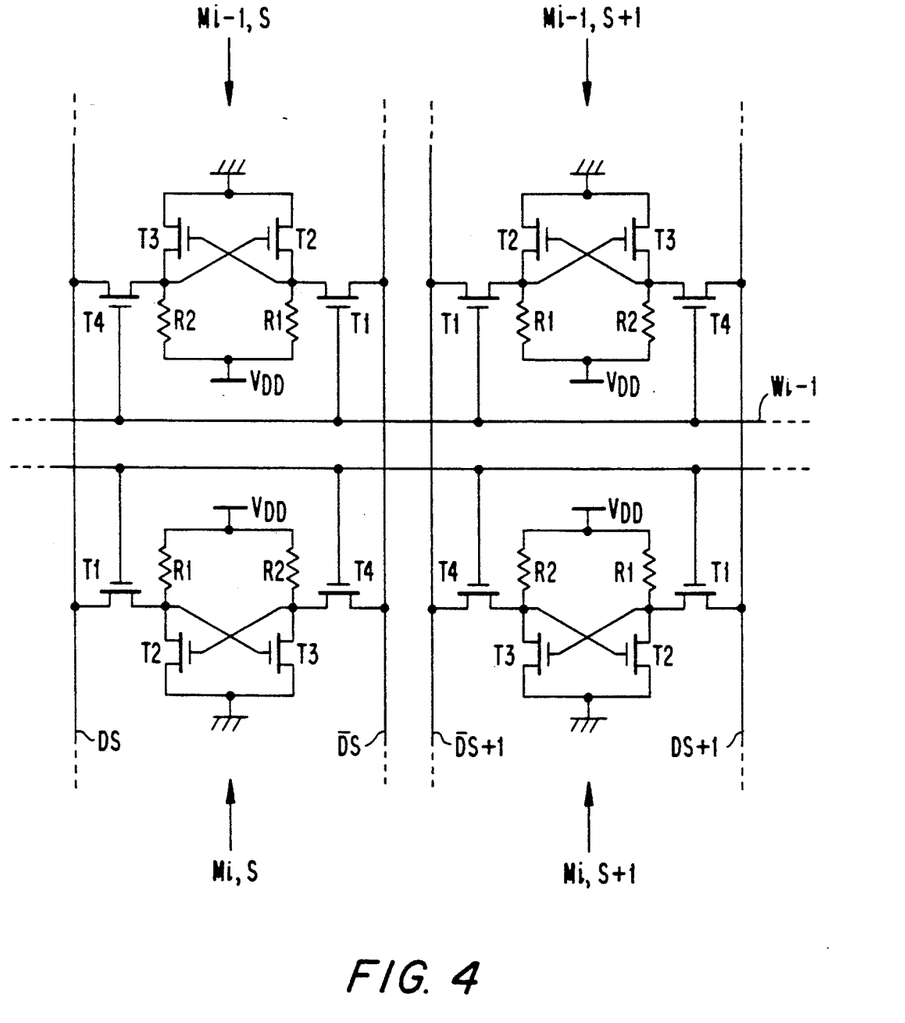
FIG. 4 is a circuit diagram of a portion of a SRAM memory cell array in the first embodiment.

Referring to FIG. 4 showing a circuit diagram of a portion of the memory cell array, the memory cell array has a capacity of 1024 word ×8 bit and includes 1024 word lines Wi (i=1, 2, 3, ..., 1024) and eight pairs of digit lines Ds and $\overline{Ds}$ (s=1, 2, 3, ..., 8).

A memory cell Mi,s is arranged at each of cross points of the word lines Wi and the digit line pairs Ds, $\overline{Ds}$. The memory cell is a flip-flop circuit of resistive load type and includes an inverter composed of a drive transistor T2 and a load resistor R1, an inverter composed of a drive transistor T3 and a load resistor R2. Input lines and output lines of these inverters are cross-connected, a drain of the drive transistor T2 is connected to the digit line Ds through a transmission transistor T1 and a drain of the drive transistor T3 is connected to the digit line $\overline{Ds}$ through a transmission transistor T4.

Figure 5A:
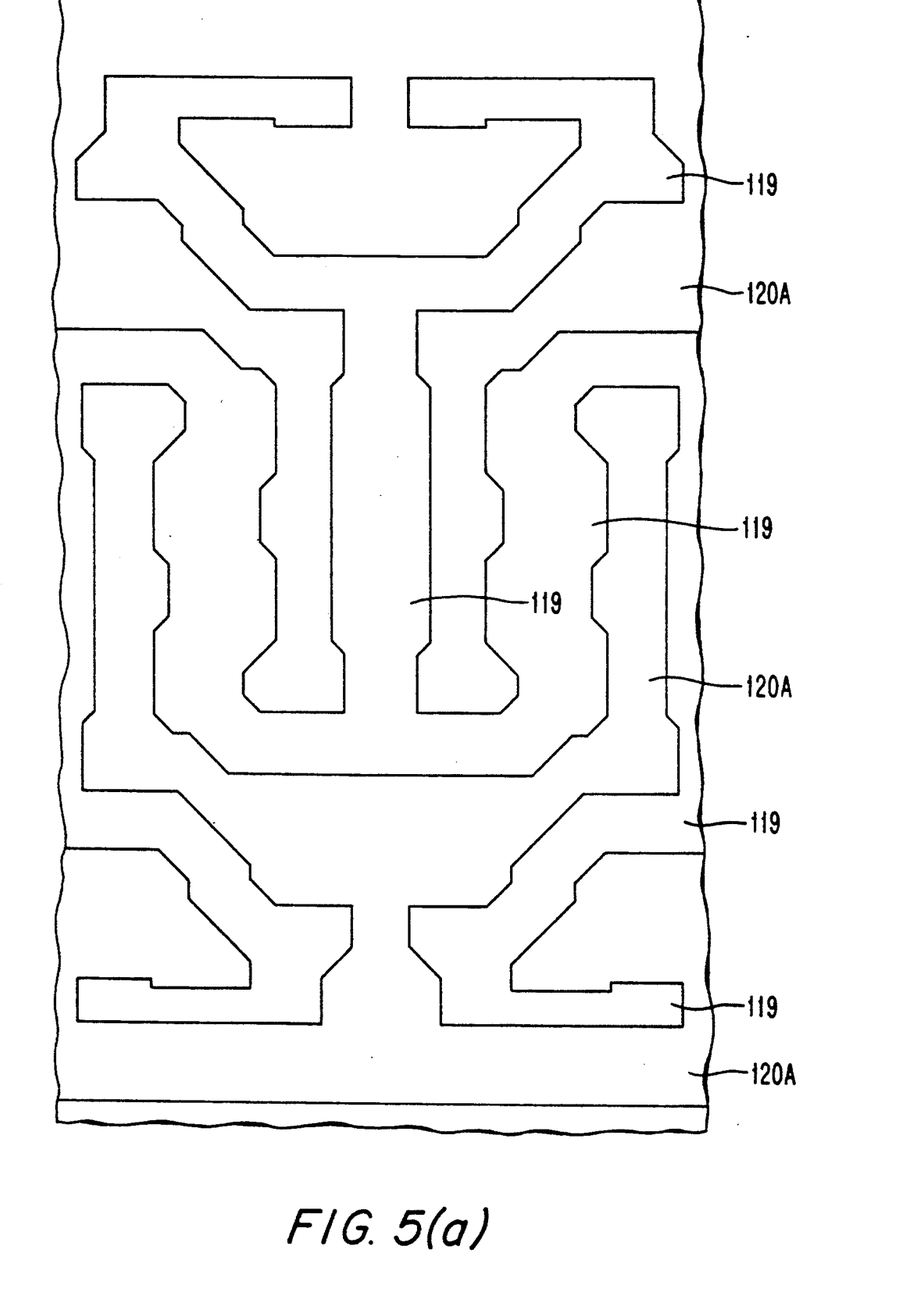
FIG. 5(a) is a plan view showing schematically an element forming region of the memory cell array in the first embodiment.
Figure 5B:
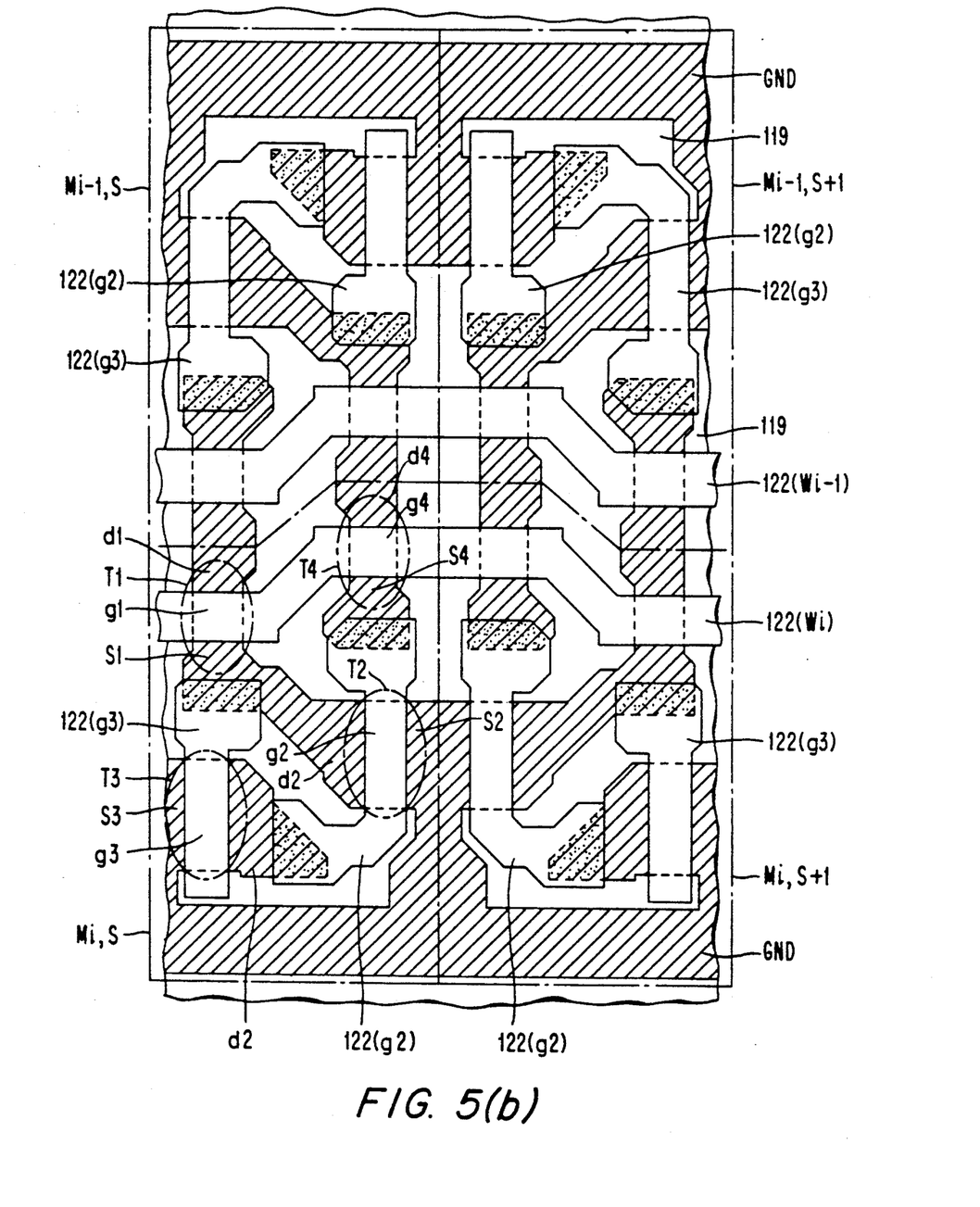
FIG. 5(b) is a plan view schematically showing an arrangement of transistors of the memory array in the first embodiment.

FIGS. 5(a) and 5(b) show an arrangement of element forming regions and transistors in a portion of the memory cell array. Hatched portions in FIG. 5(b) show the N+ type impurity diffusion layer selectively formed in the surface portion of the P type silicon substrate and cross-hatched portions show direct contacts.

The N+ type impurity diffusion layer is formed by ion injection to an element forming region 120A (FIG. 5(a)) sectioned by the field oxide film 119 using the first polysilicon film 122 as a mask. The N+ type impurity diffusion layer is used as source regions (s1, s2, s3 and s4) and drain regions (d1, d2, d3 and d4) of the N channel MOS transistors T1, T2, T3 and T4 which constitute the memory cells Mi,s and a grounding wiring GND. The first polysilicon film 122 constitutes gate electrodes g1, g2, g3 and g4 of the N channel MOS transistors T1, T2, T3 and T4 and also a portion (word electrodes) of the word lines Wi, Wi−1. The word lines are constituted with a first polysilicon film and a second polysilicon film.

Figure 6:
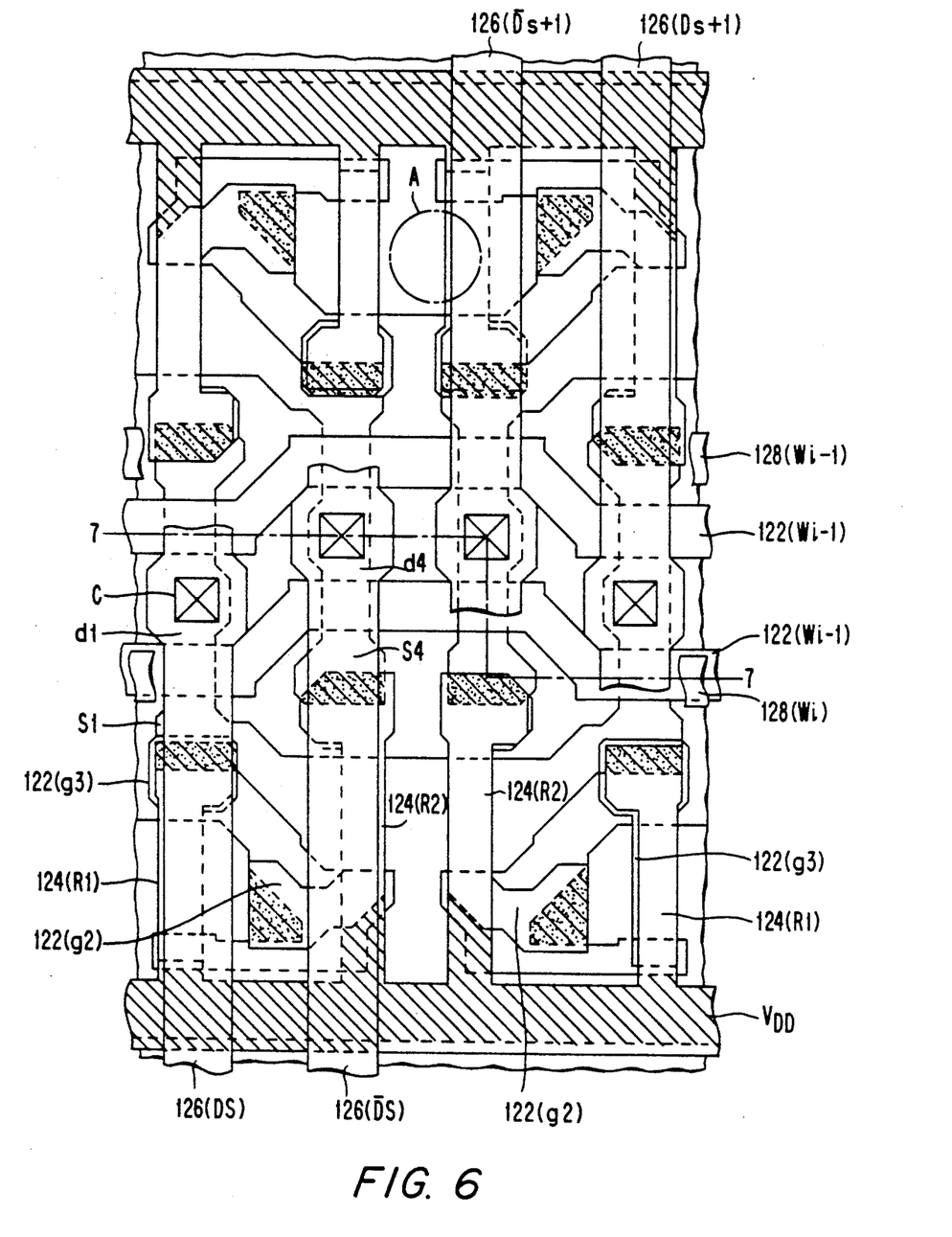
FIG. 6 is a plan view schematically showing a portion of the memory cell array in the first embodiment.
Figure 7:
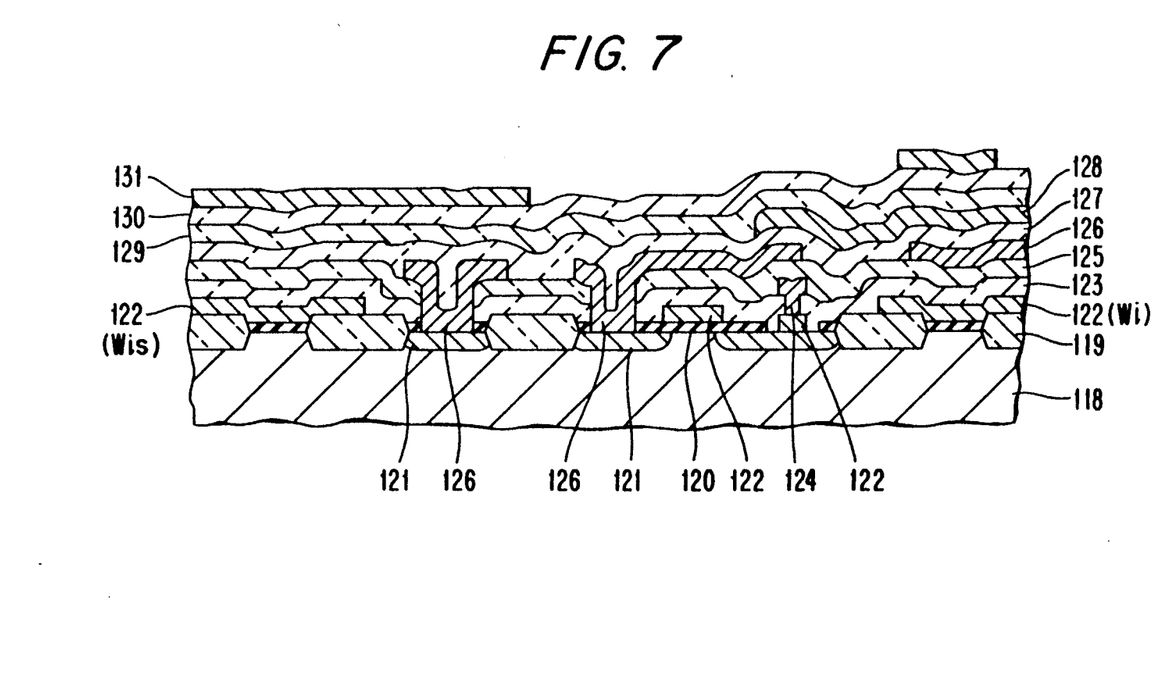
FIG. 7 is a cross section taken along a line X—X in FIG. 6.

This embodiment will be described along with fabricating steps shown in FIG. 6 and FIG. 7 which is a cross section taken along a line X—X in FIG. 6. In FIG. 6, direct contacts are shown by cross-hatching and a doping portion of the second level polysilicon film is shown by hatching.

The element forming region 120A (FIG. 5(a)) is sectioned by forming the field oxide film 119 by selective oxidation of the surface of the P type silicon substrate 118. Then, a silicon oxide film 11 nm thick is formed on the element forming region as the gate oxide film 120. Then, portions of the gate oxide film 120 which include the cross-hatched regions in FIGS. 5 and 6 and in which the direct contacts are to be formed are removed. After the first level polysilicon film 122 having thickness of 0.4 μm and doped with phosphor at density of $1 \times 10^{21}/cm^3$ is formed, the first level polysilicon film 122 is etched with a predetermined pattern to form the gate electrodes g1, g2, g3 and g4 having a gate length of 0.6 μm and the word electrodes which are 122(Wi), 122(Wi−1) in FIG. 5 and connect the transmission transistors T1 and T4 in the word line direction. Then, the N+ type impurity diffusion layer is formed by ion injection into the element forming regions 121 (FIG. 7) using the polysilicon film 122 and the field oxide film 119 as masks. Thereafter, the first inter-layer insulating film 123 having thickness of 1.0 μm is formed thereon.

Then, through-holes are formed in the first inter-layer insulating film 123 at portions between the gate electrodes g3 and g1 and the gate electrodes g2 and g4. A non-doped, second polysilicon film 124 having thickness of 0.2 μm is formed thereon and patterned to a shape having branch portions overlapped with main portions of the gate electrodes g2 and g3 and a tree portion connecting these branch portions. Thereafter, the portions of the first inter-layer insulating film 123 which are in contact with the gate electrodes g2 and g3 and the tree portion and portions in the vicinity thereof are doped with phosphor at a density of $2 \times 10^{20}/cm^3$ using a silicon nitride film which is not shown as a mask.

Thus, the wirings for the load resistors R1 and R2 and the power source ($V_{DD}$) are formed. Then, a second inter-layer insulating film 125 is formed, through-holes are formed down to the drain regions d1 and d4, a first level aluminum film 126 having thickness of 0.6 $\mu$m is formed and then the latter is etched to form the digit lines Ds, $\overline{Ds}$, Ds+1, $\overline{Ds+1}$, . . . Thereafter, a third inter-layer insulating film 127 is formed, a second level aluminum film 128 having a thickness of 0.8 $\mu$m is formed thereon and, then, the latter is etched to form the word electrode wirings 128(Wi), . . . The word electrode wirings 128(Wi), . . . are parallel to one side of the word electrodes 122(Wi) and connected at an opposite end of the memory cell array having the 8 bit construction to the word lines 122(Wi) above the field oxide film 119.

As above-mentioned, the first inter-layer insulating film 123, the second inter-layer insulating film 125 and the third inter-layer insulating film 127, each being about 1.0 $\mu$m thick, form a three-level insulating layer film. The step of the semiconductor chip surface after the word electrode wirings 128(Wi), . . . are formed becomes maximum, about 1.0 $\mu$m, in the area shown by a chain line circle A in FIG. 6. This step is produced due to a sum of the thickness of the first level polysilicon film 122 and the second level polysilicon film 124. Therefore, if the fourth inter-layer insulating film 129 were formed thereon and the third level aluminum wiring were formed further thereon, the step coverage should become as low as about 50%, resulting in a reduction of reliability.

In the present embodiment, however, the third level aluminum wiring is not formed on the SRAMs. Instead, a fifth inter-layer insulating film 130 is formed and the fourth level aluminum wiring 131 is formed thereon. With the provision of the fourth inter-layer insulating film 129 and the fifth inter-layer insulating film 130 on the second level aluminum layer 128, the step in the circle A (FIG. 6) becomes about 0.6 $\mu$m, resulting in that the step coverage of the fourth aluminum wiring (105 in FIG. 1) is improved up to about 90%. Further, the parasitic capacitance and cross-talk become smaller compared with the case where the third and fourth aluminum wirings are formed on the SRAMs.

In the first embodiment described hereinbefore, 350 k gates (occupation area being 99 mm) and two 1024 word×8 bit SRAMs could be integrated on a 1.5 mm×1.5 mm chip.

Although, in this embodiment, the third level aluminum wiring layer was not provided on the SRAM, it is possible to form the third level aluminum wiring layer in the form of a single sheet or a mesh on the fourth inter-layer insulating film 129 on whole surface of the SRAM and use it as a shield electrode. In such a case, cross-talk between signal lines can be removed substantially completely. The shield electrode itself is not seriously affected by the step coverage. Further, the shield electrode does not increase the step of the surface of the fifth inter-layer insulating film 130 but, rather, reduces it.

Figure 8:
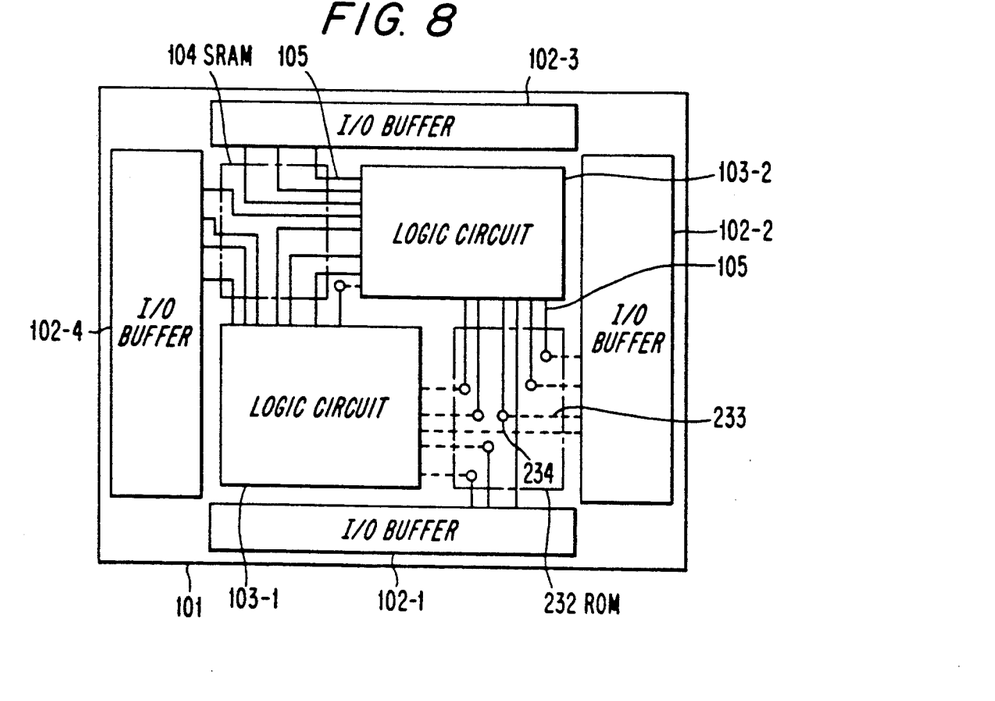
FIG. 8 is a schematic plan view of a semiconductor chip according to a second embodiment of the present invention.

A second embodiment of the present invention will be described with reference to FIG. 8.

In the second embodiment, a ROM 232 in addition to the logic circuit blocks 103-1 and 103-2 and the SRAM 104 is integrated on the single semiconductor chip. The ROM 232 uses the first level aluminum wiring layer as its uppermost wiring layer. Each memory cell is an N channel MOS transistor having a gate electrode formed of the first level polysilicon film and the word lines are constructed by arranging the gate electrodes of a plurality of N channel MOS transistors in parallel. The digit lines are of the first level aluminum wiring layer. The peripheral circuit is also constructed with the first level polysilicon film and the first level aluminum wiring layer. Therefore, it is possible to connect the logic circuit block 103-1 to the block 103-2 and the logic circuit 103-1 and 103-2 to the input/output buffers 102-1 and 102-2 by forming the third level aluminum wiring layer 233 shown by a chain line on an area overlapping on the ROM 232 and the fourth level aluminum wiring layer 105. The third level aluminum wiring layer 233 and the fourth level aluminum wiring layer 105 are connected to each other through through-holes 234. Since the wiring layer formed on the ROM 232 is of the third level aluminum wiring layer, it is possible to make its density higher than that of the wiring (formed of only the fourth aluminum wiring layer) on the SRAM 104.

Although the present invention has been described with reference to the embodiments in which the logic circuit blocks 103-1 and 103-2 are constituted with CMOS gate arrays and the function blocks include MOS type SRAMs and MOS type ROM, the logic circuit blocks 103-1 and 103-2 may be constituted with Bi-CMOS gate arrays or with standard master slice systems such as standard cells. Further, the function blocks may be constituted with not only memories such as SRAM, ROM, PROM and/or DRAM but also ALU, PLA and/or CPU, etc.

Further, the fourth level aluminum wiring layer of the described embodiments may be of not only aluminum but also may be an alloy of aluminum with silicon or copper, etc., or any other metal. The number (n+2) of such metal wiring layers is arbitrary so long as the function block is constructed with lower wiring layers whose number is smaller than that of the logic circuit block by 2 and the (n+1)th metal wiring layer is not provided on the function block as the signal lines.

Although the present invention has been described with reference to specific embodiments, this description is not meant to be contrued in a limiting sense. Various modifications of the disclosed embodiment, as well as other embodiments of the present invention, will become apparent to persons skilled in the art upon reference to the description of the present invention. It is, therefore, contemplated that the appended claims will cover any modifications or embodiments as fall within the scope of the invention.

What is claimed is:

1. A semiconductor integrated circuit device comprising:
  at least one function block having first to N-th level wiring layers, with N being an integer, and first to N-th level inter-layer insulating films on which said first to N-th level wiring layers are formed, respectively, said at least one function block further having (N+1)th and (N+2)th level inter-layer insulating films, the (N+1)th level inter-layer insulating film covering the N-th level wiring layer and the (N+2)th level inter-layer insulating film being formed on the (N+1)th level insulating film; and
  at least one logic block having first to (N+2)th level wiring layer and first to (N+2)th level inter-layer insulating films on which the first to (N+2)th level wiring layers are formed, respectively, said at least one logic block further having an interconnection wiring layer which is formed of the (N+2)th level wiring layer and elongated from said at least one logic block to pass over said at least one function block;

said interconnection wiring layer elongated from said at least one logic block being formed on the (N+2)th level inter-layer insulating film in said at least one function block to pass over said at least one function block in isolation from said at least one function block by the (N+1)th and (N+2)th level inter-layer insulating films.

2. The semiconductor integrated circuit device as claimed in claim 1, wherein said at least one function block comprises a memory and said at least one logic block comprises a gate array.

3. The semiconductor integrated circuit device as claimed in claim 1, wherein input/output buffers are arranged on a peripheral circuit portion of said semiconductor integrated circuit device, and at least one of said input/output buffers is connected through said interconnection wiring layer to said at least one logic block.

4. The semiconductor integrated device as claimed in claim 3, wherein said peripheral circuit portion uses the first level wiring layer.

5. The semiconductor integrated device as claimed in claim 1, wherein N is at least 2 and input/output terminals of said at least one function block are formed using the first and the second level wiring layers.

6. The semiconductor integrated circuit device as claimed in claim 1, wherein N is at least 2 and said at least one function block and said at least one logic block are connected by the first and the second level wiring layers.

7. The semiconductor integrated circuit device as claimed in claim 6, wherein said first level wiring layer is in an X direction and said second level wiring layer is in a Y direction.

8. The semiconductor integrated circuit device as claimed in claim 1, wherein N=2.

9. A semiconductor integrated circuit device comprising:

at least one function block having first to N-th level wiring layers, with N being an integer, and first to N-th level inter-layer insulating films on which said first to N-th level wiring layers are formed, respectively, said at least one function block further having (N+1)th and (N+2)th level inter-layer insulating films, the (N+1) level inter-layer insulating film covering the N-th level wiring layer and the (N+2)th level inter-layer insulating film being formed on the (N+1)th level insulating film;

at least one logic block formed of a master slice system having first to (N+2)th level wiring layers and first to (N+2)th level inter-layer insulating films on which said first to (N+2)th level wiring layers are formed, respectively, said at least one logic block further having an interconnection wiring layer which is formed of the (N+2)th level wiring layer and elongated from said at least one logic block to pass over said at least one function block; and a shield layer formed of the (N+1)th level wiring layer in said at least one function block, said shield layer being formed between the (N+1)th and (N+2)th level insulating films in said at least one function block;

said interconnection wiring layer elongated from said at least one logic block formed on the (N+2)th level inter-layer insulating film of said at least one function block to pass over said at least one function block isolated by the (N+1)th and (N+2)th level insulating film and said shield layer.

10. The semiconductor integrated circuit device as claimed in claim 9, wherein said at least one function block comprises a memory and said at least one logic circuit block comprises a gate array.

* * * * *